United States Patent
Licausi (10) Patent No.: US 9,530,654 B2
(45) Date of Patent: Dec. 27, 2016

(54) FINFET FIN HEIGHT CONTROL

(71) Applicant: GLOBALFOUNDRIES Inc., Grand Cayman (KY)

(72) Inventor: Nicholas V. Licausi, Watervliet, NY (US)

(73) Assignee: GLOBALFOUNDARIES INC., Grand Cayman (KY)

( * ) Notice: Subject to any disclaimer, the term of this patent is extended or adjusted under 35 U.S.C. 154(b) by 0 days.

(21) Appl. No.: 13/862,819

(22) Filed: Apr. 15, 2013

(65) Prior Publication Data
US 2014/0306317 A1   Oct. 16, 2014

(51) Int. Cl.
| | | |
|---|---|---|
| H01L 21/308 | (2006.01) | |
| H01L 21/306 | (2006.01) | |
| H01L 27/088 | (2006.01) | |
| H01L 29/66 | (2006.01) | |
| H01L 21/8234 | (2006.01) | |
| H01L 21/762 | (2006.01) | |
| H01L 21/3105 | (2006.01) | |

(52) U.S. Cl.
CPC ....... *H01L 21/30625* (2013.01); *H01L 21/762* (2013.01); *H01L 21/823431* (2013.01); *H01L 27/0886* (2013.01); *H01L 29/66795* (2013.01); *H01L 21/3105* (2013.01)

(58) Field of Classification Search
CPC ............. H01L 29/66795; H01L 29/785; H01L 21/823431; H01L 21/823821; H01L 27/0924; H01L 27/0886
USPC ....................................................... 438/300
See application file for complete search history.

(56) References Cited

U.S. PATENT DOCUMENTS

| | | | | |
|---|---|---|---|---|
| 6,387,761 B1 * | 5/2002 | Shih et al. | ..................... | 438/287 |
| 7,094,650 B2 * | 8/2006 | Chaudhary et al. | .......... | 438/283 |
| 7,635,632 B2 * | 12/2009 | Yeo et al. | ..................... | 438/283 |
| 8,148,780 B2 * | 4/2012 | Tang et al. | ..................... | 257/347 |
| 8,354,320 B1 * | 1/2013 | Xie | ................... | H01L 29/66795 |
| | | | | 438/279 |
| 8,361,894 B1 * | 1/2013 | Hargrove | .............. | H01L 21/845 |
| | | | | 257/E21.4 |
| 8,460,984 B2 * | 6/2013 | Wahl | ................. | H01L 21/82343 |
| | | | | 257/353 |
| 8,461,008 B2 * | 6/2013 | Cho | ............................ | 438/296 |
| 8,476,137 B1 * | 7/2013 | LiCausi | ............ | H01L 21/82343 |
| | | | | 257/296 |

(Continued)

*Primary Examiner* — Mary Wilczewski
(74) *Attorney, Agent, or Firm* — Heslin Rothenberg Farley & Mesiti P.C.

(57) ABSTRACT

Fin height control techniques for FINFET fabrication are disclosed. The technique includes a method for controlling the height of plurality of fin structures to achieve uniform height thereof relative to a top surface of isolation material located between fin structures on a semiconductor substrate. The isolation material located between fin structures may be selectively removed after treatment to increase its mechanical strength such as by, for example, annealing and curing. A sacrificial material may be deposited over the isolation material between the fin structures in a substantially uniform thickness. The top portion of the fin structures may be selectively removed to achieve a uniform planar surface over the fin structures and sacrificial material. The sacrificial material may then be selectively removed to achieve a uniform fin height relative to the isolation material.

12 Claims, 5 Drawing Sheets

(56) References Cited

U.S. PATENT DOCUMENTS

| | | | | |
|---|---|---|---|---|
| 8,481,410 B1* | 7/2013 | LiCausi | H01L 21/82382 | 257/253 |
| 8,547,739 B2* | 10/2013 | Tang et al. | | 365/174 |
| 8,896,067 B2* | 11/2014 | Bergendahl | H01L 21/82343 | 257/368 |
| 9,287,385 B2* | 3/2016 | Liu | H01L 21/82343 | |
| 9,331,074 B1* | 5/2016 | Chang | H01L 27/0886 | |
| 2005/0199919 A1* | 9/2005 | Liu | H01L 29/66795 | 257/288 |
| 2008/0128797 A1* | 6/2008 | Dyer | H01L 29/785 | 257/328 |
| 2011/0068431 A1* | 3/2011 | Knorr | H01L 21/76229 | 257/506 |
| 2011/0147848 A1* | 6/2011 | Kuhn | H01L 21/76229 | 257/368 |
| 2011/0260282 A1* | 10/2011 | Kawasaki | H01L 21/76229 | 257/506 |
| 2012/0313169 A1* | 12/2012 | Wahl | H01L 21/82343 | 257/347 |
| 2013/0009246 A1* | 1/2013 | Cheng | H01L 29/785 | 257/350 |
| 2013/0049136 A1* | 2/2013 | Wahl | H01L 21/82343 | 257/401 |
| 2013/0056826 A1* | 3/2013 | Liu | H01L 21/82343 | 257/347 |
| 2013/0309856 A1* | 11/2013 | Jagannathan et al. | | 438/587 |
| 2014/0159171 A1* | 6/2014 | Cai | H01L 29/785 | 257/412 |
| 2014/0191323 A1* | 7/2014 | Bergendahl | H01L 21/82343 | 257/368 |
| 2014/0252497 A1* | 9/2014 | Peng et al. | | 257/401 |
| 2014/0306317 A1* | 10/2014 | Licausi | H01L 21/30625 | 257/506 |
| 2015/0145068 A1* | 5/2015 | Chen | H01L 29/785 | 257/401 |
| 2015/0380526 A1* | 12/2015 | Godet | H01L 29/66795 | 438/482 |
| 2016/0071932 A1* | 3/2016 | Sung | H01L 29/1033 | 257/369 |
| 2016/0181095 A1* | 6/2016 | Cheng | H01L 21/02532 | 257/616 |
| 2016/0204265 A1* | 7/2016 | Sung | H01L 29/1033 | 257/401 |

* cited by examiner

FINFET FIN HEIGHT CONTROL

FIELD OF THE INVENTION

The present invention generally relates to semiconductor devices and methods of fabricating semiconductor devices, and more particularly, to methods of FINFET fin height control, that is, to methods of obtaining substantially uniform fin heights in fin structures, for example, during bulk FINFET fabrication.

BACKGROUND OF THE INVENTION

In contrast to traditional planar metal-oxide-semiconductor, field-effect transistors (MOSFETs), which are fabricated using conventional lithographic fabrication methods, non-planar FETs incorporate various vertical transistor structures. One such semiconductor structure is the "FINFET", which takes its name from the multiple semiconductor "fins" that are used to form the respective gate channels in the field effect transistor, and which are typically on the order of tens of nanometers in width. Advantageously, the fin structure helps to control current leakage through the transistor in the off stage, and a double gate or tri-gate structure may be employed to control short channel effects.

Figure 1A:
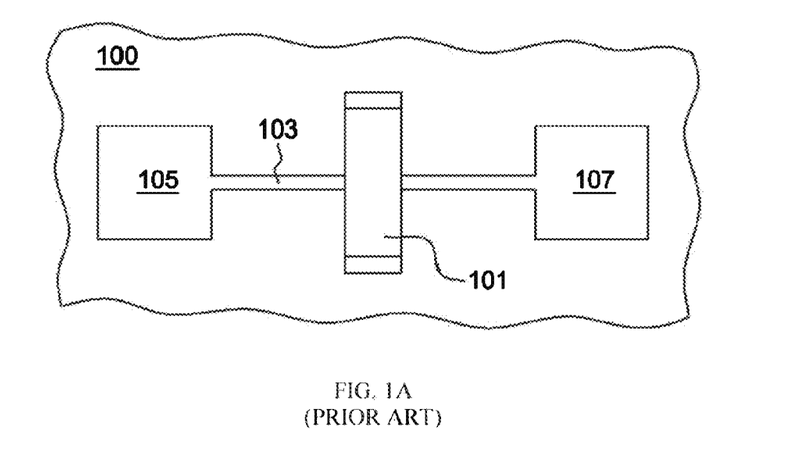
FIG. 1A is a top plan view of one embodiment of a conventional FINFET.
Figure 1B:
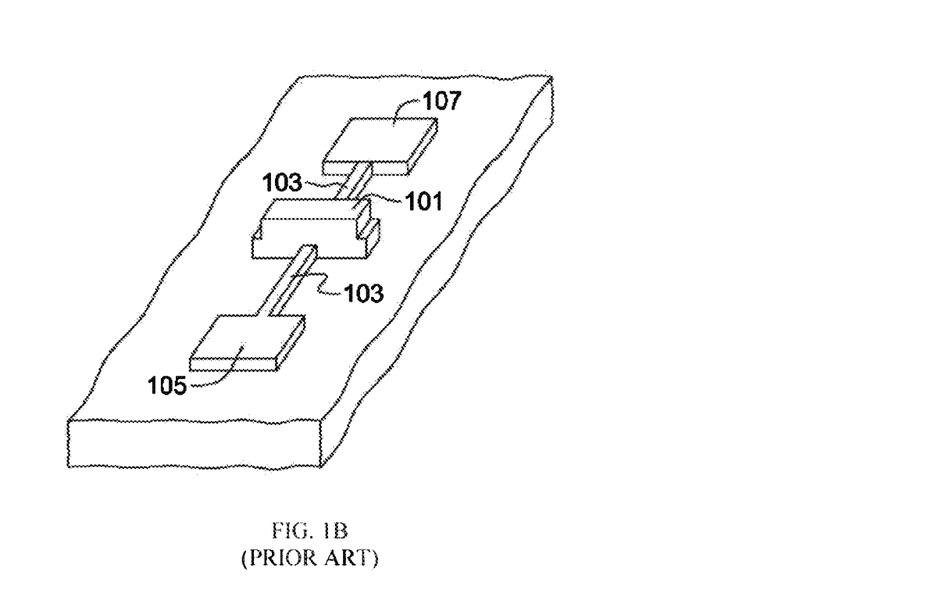
FIG. 1B is an isometric view of the FINFET of FIG. 1A.

FIGS. 1A & 1B illustrate a top plan view and isometric view, respectively, of a typical FINFET 100. In the embodiment illustrated, FINFET 100 includes a gate 101 which is wrapped around the top and sides of a fin channel 103. A source 105 is formed at one end of fin channel 103, and a drain 107 is formed at the other end.

While FIGS. 1A & 1B depict a single FINFET, during FINFET fabrication a large number of fin structures are typically provided close together in a bulk process. The fins are typically separated by a filler material such as an insulator and/or oxide material. After bulk fin formation, the fin heights relative to the filler material may not be uniform, and since the fin height controls the device width, this may result in undesired semiconductor device width. Accordingly, a need exists for an enhanced fin height control technique, for example, for use during FINFET device fabrication, which results in uniform fin height for a plurality of fins on a single substrate.

BRIEF SUMMARY

The shortcomings of the prior art are overcome and advantages are provided through the provision, in one aspect, of a method which includes providing a plurality of fin structures on a semiconductor substrate, and forming an isolation layer around bottom portions of the plurality of fins, the isolation layer having a variable thickness between the plurality of fins. The method further includes forming a sacrificial layer over the isolation layer, leaving top portions of the plurality of fins exposed, and selectively etching the exposed top fin portions, the sacrificial layer facilitating the selectively etching by acting as an etch stop so that the plurality of fins have a uniform fin height above the isolation material and variable fin heights above the substrate.

The method may further include separately depositing a sacrificial material over the isolation material between the at least two fin structures, the sacrificial material being of substantially uniform thickness. And, the method may also include selectively removing a top portion of the at least two fin structures to achieve a uniform planer surface of the at least two fin structures and sacrificial material therebetween. Also, the sacrificial material may be selectively removed. The top portion of the at least two fins may be selectively removed using chemical mechanical planarization. The planarization of the uniform planar surface yields a uniform fin height.

The sacrificial material may comprise at least one of an oxide or nitride. And, it may be deposited using flowable chemical vapor deposition. The isolation material may comprise an insulator and/or isolation oxide material. And, the isolation material and/or sacrificial material may be annealed and/or cured. The isolation material may be the same as the sacrificial material.

In yet another aspect, the invention includes an intermediate semiconductor structure. The structure includes a plurality of fin structures on a semiconductor substrate, an isolation material located between the fin structures, a sacrificial material of substantially uniform thickness located over the isolation material between the fin structures, a planar surface over the plurality of fin structures and the sacrificial material so that the height of the plurality of fin structures relative to the isolation material is substantially uniform.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Figure 2A:
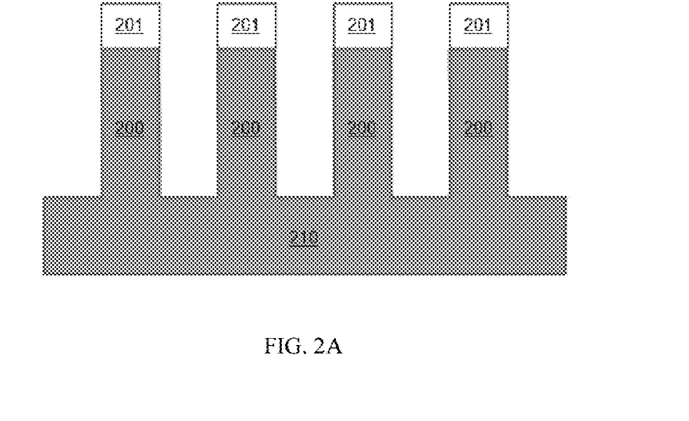
FIG. 2A depicts an embodiment of an intermediate structure after initial fabrication of the fin structures using a mask material.

FIG. 2A depicts one embodiment of an intermediate structure initially obtained one of many intermediate steps performed during bulk FINFET formation, wherein multiple fin structures 200 reside on a substrate 210, which includes, for example, a semiconductor material. This intermediate structure is initially obtained during bulk FINFET fabrication processing, which includes multiple fin structures 200 disposed on a substrate 210. In one embodiment, silicon on insulator (SOI) fabrication processing may be employed to obtain the intermediate structure depicted. A semiconductor substrate 210 is initially used to create the fin structure. In one specific example, the semiconductor material is silicon. However, other types of wafers or substrates may also be used, such as SOI wafers. Also, semiconductor materials other than silicon may be used, including but not limited to Ge, SiGe, SiC, GeP, GeN, InGaAs, GaAs, InSb, InAs, GaSb, and InP.

As illustrated, the fin structures 200 are spaced apart. In one embodiment, fin structures 200 may be formed by removing material from substrate 210, resulting in the illustrated, spaced fin structures 200. This removal processing may be facilitated by provision of a hard mask 201 patterned to provide the desired fin structure configurations. The masking material may comprise a silicon nitride or any other suitable masking material. The masking material may be deposited using any conventional techniques well known in the art such as chemical vapor deposition (CVD). The fin structures are then etched on the substrate using conventional wet or dry etching techniques including lithography, reactive ion etching (RIE) and/or plasma processing. By way of specific example, the intermediate structure illustrated may have fin structures which are spaced apart 16-40 nm with a recess of 8-20 nm wide therebetween. Also, and for example, the fins may be 100-200 nm high, measured from the surface of the substrate 210. In one bulk FINFET fabrication process, a large number of such fins are formed concurrently. The mask material is typically, for example, deposited in a layer of approximately 20-40 nm.

Figure 2B:
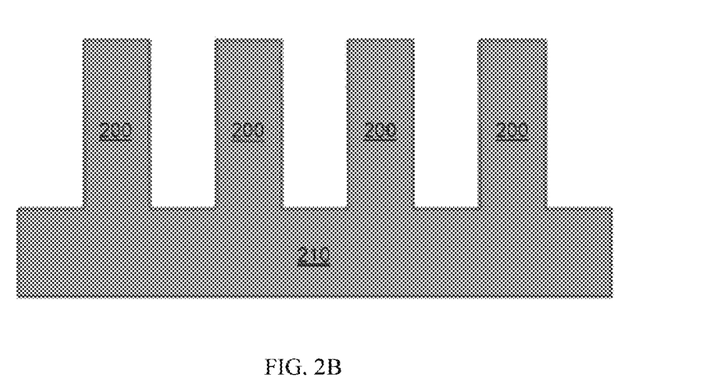
FIG. 2B depicts an intermediate structure of an embodiment of the invention after removal of the mask material depicted in FIG. 2A.

After the formation of the fins as shown in FIG. 2A, the masking material may be removed using conventional masking removal techniques as is well known in the art. Such techniques include the use of hot phosphoric acid and/or diluted hydrofluoric acid. After the removal of the masking material, the structure depicted in FIG. 2B will be achieved, which includes multiple fin structures 200 within substrate 210.

Figure 2C:
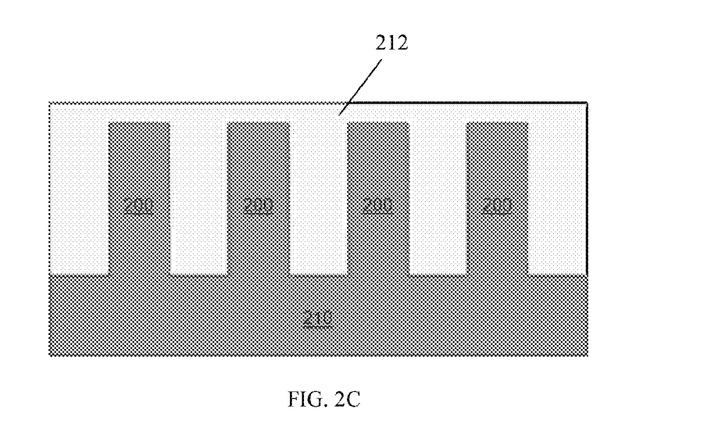
FIG. 2C depicts an embodiment of an intermediate structure of the present invention after deposition of an isolation material over the fin structures depicted in FIG. 2B.

In accordance with the principles of the present invention, an isolation material may be deposited between a plurality of the fin structures. This may result, for example, in the intermediate structure of FIG. 2C. The isolation material 212 may be deposited using conventional techniques such as plasma enhanced chemical vapor deposition (PECVD), atomic layer deposition (ALD) and/or flowable chemical vapor deposition (FCVD), which are well known in the art. For example, the isolation material 212 may include an insulator and/or oxide such as silicon dioxide which may be deposited using flowable chemical vapor deposition (FCVD). As is well known in the art, the isolation material is preferably deposited in a uniform thickness between fin structures. However, the oxide material may also be unintentionally deposited non-uniformly thereby resulting in different thicknesses of isolation material at different wafer locations.

Figure 2D:
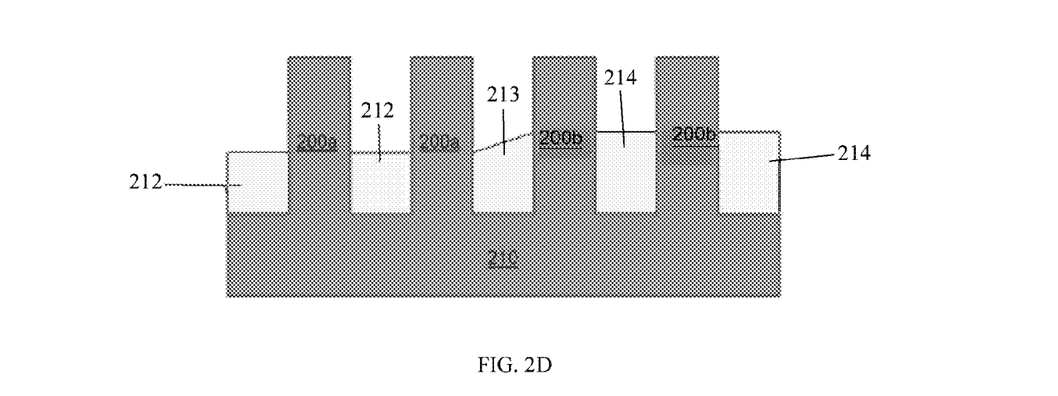
FIG. 2D depicts an intermediate structure in accordance with the principles of the present invention after removal of a portion of the isolation material previously deposited as shown in FIG. 2C.

The isolation material 212 may then be selectively removed to create a fin height relative to the isolation material, as shown in FIG. 2D. The isolation 212 material may be selectively removed using wet etch, vapor plasma etch, plasma based processes or other well known techniques. Typically, a fin height of 20-70 nm is desired and more typically 30-50 nm. The selective removal of the isolation material 212 may also result in non-uniformity in the thickness of isolation material 212 located between different fin structures. For example, as shown in FIG. 2D, after deposition of the isolation material or other processing thereof, the thickness of isolation material 212 located between and adjacent fin structures 200a, may be different than the thickness of the isolation material 214 located between different adjacent fin structures 200b. Moreover, it is also possible that the process of depositing isolation material over the semiconductor substrate 210 may result in non uniform height of the isolation material 213 located between two particular fin structures, such as fin structures 200a and 200b within substrate 210. Typically, differences in height of about 5 mm in isolation material occur in the intermediate structure of FIG. 2D.

After the deposition of the isolation material as shown in FIG. 2D, the isolation material 212, 213, 214 may be annealed and/or cured. It is desirable to remove moisture from the isolation material so as to improve its film quality. Preferably, it is desirable to increase the resistance to etching of the isolation material, by curing and/or annealing, by a factor of at least 10 to 1 and preferably by a factor of at least 100 to 1. Annealing and/or curing the isolation material will help the isolation material to withstand subsequent etching steps. The annealing and/or curing may be achieved using well known techniques including, for example, thermal annealing by a furnace and/or a rapid thermal anneal. However, after annealing or curing, non uniformity of thickness of the isolation material may be likely. To alleviate non-uniformity in fin height relative to the isolation material, further steps, as described below, should be performed.

Figure 2E:
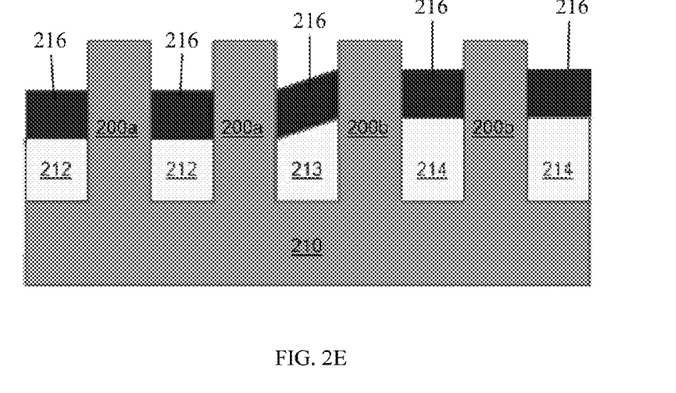
FIG. 2E depicts an intermediate structure in accordance with the principles of the present invention wherein a sacrificial material is deposited over the isolation material located between fin structures as shown in FIG. 2D.

Referring now to FIG. 2E, a sacrificial material 216 may be deposited over the substrate and isolation material between fin structures 200a, 200b in preferably a uniform thickness. The sacrificial material 216 may include silicon oxide or silicon nitride and may be deposited using FCVD techniques. Preferably, the sacrificial material thickness should be 20-40 nm, or more preferably 20-30 nm. The chemical hardening of the isolation material 212, 214 by for example, annealing and/or curing allows the use of the sacrificial material 216 to be deposited by FCVD in a relatively uniform thickness thereof. As shown in FIG. 2E, the resultant intermediate structure includes fin structures 200a, 200b, which are higher than the isolation material 212, 213, 214 and sacrificial material 216 located in the recesses therebetween and/or adjacent the fin structures. The sacrificial material may then be used as a stop for subsequent CMP processing of the fin structures 200a, 200b. The sacrificial material may also be cured and annealed particularly if the sacrificial is made of a material different than the isolation material. If the sacrificial material and isolation material are the same material, it may be desirable to not anneal or cure the sacrificial material. If the isolation material is cured or annealed, the sacrificial material (made of the same material) may be more easily selectively removed thereafter, as described below.

Figure 2F:
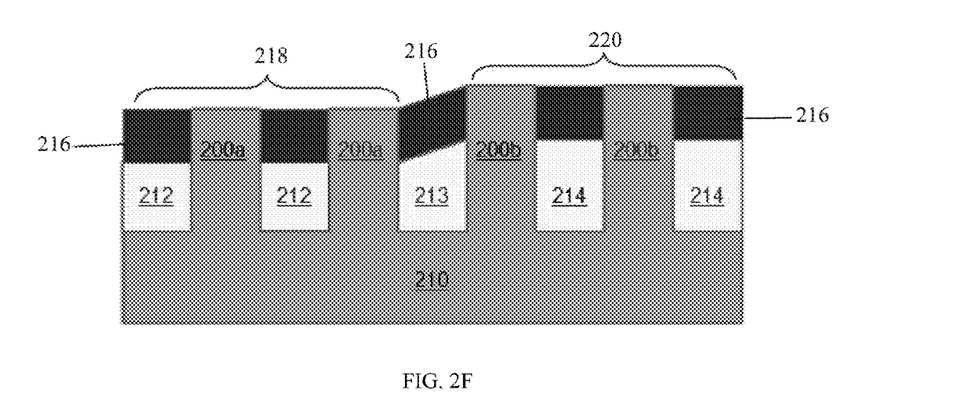
FIG. 2F depicts an intermediate structure in accordance with the principles of the present invention wherein the fin structures have been processed using a CMP process to create a planar surface in between and/or adjacent at least two fin structures.

In subsequent processing of the intermediate structure shown in FIG. 2E, an intermediate structure as shown in FIG. 2F may be achieved. A CMP process, for example, a CMP slurry may be used to create substantially planar surfaces 218, 220 over the fin structures 200a, 200b and isolation material 212, 214 and sacrificial material 216 located between the various fin structures and adjacent thereto. Using, for example, a CMP slurry, the mechanical polishing pad may cease planarization when the pad comes into contact with the sacrificial material, which may be for example silicon dioxide or silicon nitride. Using this or any similar CMP technique to achieve a substantially uniform planar surface, an intermediate semiconductor structure similar to FIG. 2F may be achieved. In such a structure, a plurality of fin structures 200a and sacrificial material 216 as well as isolation material 212 (which has been mechanically hardened), may be formed with a substantially planar surface 218 on the top thereof. Similarly, other fin structures 200b formed within the same semiconductor substrate 210 may together with sacrificial material 216 and isolation material 214 located there between and adjacent thereof, form a substantially uniform planar surface 220 thereon.

Figure 2G:
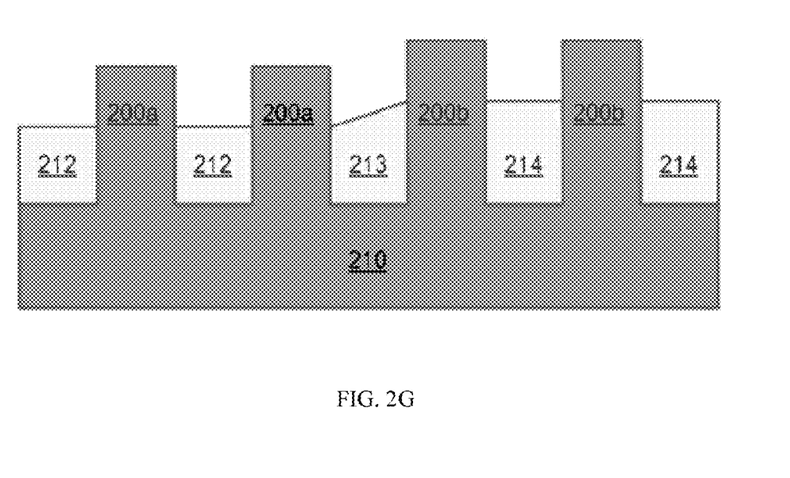
FIG. 2G depicts an intermediate structure in accordance with the principles of the present invention after selective removal of the sacrificial material depicted in FIG. 2F thereby resulting in a uniform fin height over at least 2 fin structures relative to the top surface of the isolation material between and/or adjacent thereto.

Following the creation of the intermediate structure depicted in FIG. 2F, or a similar structure with substantially uniform planar surfaces, the sacrificial material 216 may be selectively removed thus, resulting in the intermediate structure of FIG. 2G. The removal of the sacrificial material, which may be a silicon dioxide or silicon nitride, may be achieved using wet processes having a very high selectivity to the fins, e.g. silicon, as well as a very high selectivity to the isolation material, which may be silicon dioxide. Such a wet process may include the use of hot phosphorus techniques or diluted hydrofluoric acid. Furthermore, if the sacrificial material has not been substantially strengthened by, for example, curing and/or annealing, a wet process may be performed to remove the sacrificial material and not the isolation material with improved selectivity (even if both are SiO2 in nature). As shown in FIG. 2G the height of a plurality of fin structures 200a relative to the isolation material 212 located adjacent and/or therebetween, may be substantially uniform. Similarly, the height of other fin structures 200b, located within the same substrate 210 as fin structures 200b may also be substantially uniform in height relative to the isolation material 214 located therebetween fin structures 200b and/or adjacent thereto. The relative height of the fin structures to the isolation material may be measured from the top surfaces of the fin structures 200a, 200b (nearest the isolation material) to the top surfaces of the isolation material 212, 214 (nearest the fin).

The substrate and fin structure may then be further processed to create gates thereon using conventional fabrication techniques to form FINFET semiconductor devices. The process depicted herein used, to achieve the intermediate structures depicted in FIGS. 2A 2E, are for purposes of simplicity shown as having only a few fin structures on a single substrate. However, the invention allows any number of fin structures on a substrate to be formed with uniform height relative to the isolation material.

Thus, in accordance with the principles of the present intervention an important parameter for the FINFET device function, namely the height of the fin which protrudes out of the isolation oxide may be effectively controlled. By achieving a uniform fin height over a plurality of fins, the device width of a semiconductor device may also be effectively controlled. The current invention provides a technique for forming a fin structure by using a FCVD sacrificial material such as an oxide or nitride to provide a stopping point for CMP of the fins. In this manner, the fin height can be controlled so as to achieve a uniform fin height across a wafer. Thus, fin height is therefore not limited by CMP uniformity, fin etch depth uniformity or isolation oxide recess uniformity. Rather, the result in fin height is limited by the sacrificial material deposition uniformity, e.g. FCVD oxide and/or nitride uniformity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:
1. A method comprising:
providing a plurality of fins on a semiconductor substrate;

forming an isolation layer around bottom portions of the plurality of fins, wherein the isolation layer has a variable thickness between the plurality of fins;

forming a sacrificial layer over the isolation layer, leaving top portions of the plurality of fins exposed; and selectively etching the exposed top fin portions, wherein the sacrificial layer facilitates the selectively etching by acting as an etch stop so that the plurality of fins have a uniform fin height above the isolation material and variable fin heights above the substrate.

2. The method of claim 1, wherein the sacrificial layer has a substantially uniform thickness over the isolation layer.

3. The method of claim 1 wherein selectively etching the exposed top fin portions comprises planarizing the top fin portions, the planarizing configured to terminate when the plurality of fins are co-planar with an upper surface of the sacrificial layer.

4. The method of claim 3 further comprising selectively removing the sacrificial layer to expose the plurality of fins having the uniform height above the isolation layer.

5. The method of claim 3 wherein the selectively removing the exposed top fin portions is performed using chemical mechanical planarization.

6. The method of claim 1 wherein the isolation layer comprises at least one of an insulator and isolation oxide layer.

7. The method of claim 1 wherein the providing the sacrificial layer is performed using flowable chemical vapor deposition.

8. The method of claim 7 wherein the sacrificial layer comprises at least one of an oxide or nitride.

9. The method of claim 7 further comprising at least one of annealing and curing the isolation layer.

10. The method of claim 7 wherein the isolation layer is the same as the sacrificial layer.

11. The method of claim 7 wherein the sacrificial layer is at least one of annealed and cured.

12. The method of claim 1, further comprising removing the sacrificial layer after the selectively etching.

* * * * *